(12) United States Patent
Chen

(10) Patent No.: US 12,490,585 B2
(45) Date of Patent: Dec. 2, 2025

(54) DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Huipeng Chen, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 374 days.

(21) Appl. No.: 17/772,739

(22) PCT Filed: Mar. 25, 2022

(86) PCT No.: PCT/CN2022/082911
§ 371 (c)(1),
(2) Date: Apr. 28, 2022

(87) PCT Pub. No.: WO2023/173463
PCT Pub. Date: Sep. 21, 2023

(65) Prior Publication Data
US 2023/0301136 A1 Sep. 21, 2023

(30) Foreign Application Priority Data
Mar. 18, 2022 (CN) .......... 202210271195.8

(51) Int. Cl.
*H01L 51/52* (2006.01)
*H10K 50/80* (2023.01)
(Continued)

(52) U.S. Cl.
CPC ......... *H10K 50/865* (2023.02); *H10K 50/868* (2023.02); *H10K 50/87* (2023.02); *H10K 2102/311* (2023.02)

(58) Field of Classification Search
CPC ......... H10K 59/10–221; H10K 50/865; H10K 50/868; H10K 50/126; H10K 50/00–88; Y02E 10/549; G09F 9/301
See application file for complete search history.

(56) References Cited

U.S. PATENT DOCUMENTS

2020/0185658 A1* 6/2020 Tang .................... H10K 50/868
2020/0273379 A1* 8/2020 Wang .................... G09F 9/301
(Continued)

FOREIGN PATENT DOCUMENTS

CN 110277022 A 9/2019
CN 111667770 A 9/2020
(Continued)

OTHER PUBLICATIONS

English Translation of Wang (Year: 2021).*
(Continued)

*Primary Examiner* — Steven B Gauthier
*Assistant Examiner* — Rhys Poniente Sheker
(74) *Attorney, Agent, or Firm* — PV IP PC; Christopher S. Ruprecht; Wei Te Chung

(57) ABSTRACT

Embodiments of the present invention provide a display device. The display device includes a display panel and a display module, the display module includes a first supporting layer, an adhesive layer and a second supporting layer, and an accommodation cavity is formed between the adhesive layer, the first supporting layer and the second supporting layer. The accommodating cavity structure is correspondingly arranged in the bending region of the flexible display panel, thereby improving the structure of the display
(Continued)

module and effectively improving the overall performance of the display panel.

18 Claims, 6 Drawing Sheets

(51) Int. Cl.
*H10K 50/86* (2023.01)
*H10K 50/87* (2023.01)
*H10K 102/00* (2023.01)

(56) References Cited

U.S. PATENT DOCUMENTS

| | | | |
|---|---|---|---|
| 2021/0066624 A1* | 3/2021 | Wang | H10K 77/111 |
| 2022/0011819 A1* | 1/2022 | Shin | H04M 1/0268 |
| 2022/0044599 A1 | 2/2022 | La et al. | |
| 2022/0058991 A1* | 2/2022 | Lee | G09F 9/301 |
| 2022/0173354 A1* | 6/2022 | Song | G09F 9/301 |
| 2022/0199922 A1* | 6/2022 | Choi | B32B 27/308 |
| 2022/0199923 A1* | 6/2022 | Yamane | B32B 15/085 |
| 2023/0006173 A1* | 1/2023 | Kim | H10K 59/40 |
| 2023/0080858 A1* | 3/2023 | Lee | G06F 1/1652 |
| | | | 361/807 |
| 2024/0057460 A1* | 2/2024 | Wu | H10K 59/8794 |
| 2024/0145900 A1* | 5/2024 | Gu | G06F 1/1698 |

FOREIGN PATENT DOCUMENTS

| | | | | |
|---|---|---|---|---|
| CN | 111682000 A | | 9/2020 | |
| CN | 112116875 A | | 12/2020 | |
| CN | 112927625 A | | 6/2021 | |
| CN | 113053247 A | * | 6/2021 | ............ G09F 9/301 |
| CN | 113724631 A | | 11/2021 | |
| CN | 113793552 A | * | 12/2021 | |

OTHER PUBLICATIONS

Wang Translation (Year: 2021).*
Chinese Office Action issued in corresponding Chinese Patent Application No. 202210271195.8 dated Oct. 21, 2022, pp. 1-7, 13pp.
Chinese Office Action issued in corresponding Chinese Patent Application No. 202210271195.8 dated May 16, 2023, pp. 1-5, 13pp.
Chinese Office Action issued in corresponding Chinese Patent Application No. 202210271195.8 dated Feb. 28, 2024, pp. 1-7, 16pp.
Chinese Rejection Decision issued in corresponding Chinese Patent Application No. 202210271195.8 dated Aug. 23, 2023, pp. 1-5, 13pp.
PCT International Search Report for International Application No. PCT/CN2022/082911, mailed on Aug. 2, 2022, 8pp.
Written Opinion of the International Search Authority in International application No. PCT/CN2022/082911, mailed on Aug. 2, 2022, 8pp.

* cited by examiner

DISPLAY DEVICE

CROSS REFERENCE TO RELATED APPLICATIONS

This application is a National Phase of PCT Patent Application No. PCT/CN2022/082911 having International filing date of Mar. 25, 2022, which claims the benefit of priority of Chinese Patent Application No. 202210271195.8, filed Mar. 18, 2022, the contents of which are all incorporated herein by reference in their entirety.

FIELD OF INVENTION

The present application relates to fields of display panel design and panel manufacturing, and particularly to a display device.

BACKGROUND

With the development of display technologies such as the manufacturing process of display panels, people have put forward higher requirements for the performance and quality of display panels and devices.

Compared with traditional liquid crystal displays (LCD), organic light-emitting diode (OLED) devices are used in many fields because of their advantages of light weight, wide viewing angle, and high luminous efficiency. Among them, for the flexible display panel, since the flexible panel has good bending performance, it can be bent or folded to a certain extent according to different working conditions, and therefore, it is widely used in various fields. However, for a flexible display panel, the quality of its bending performance will directly affect the quality of the display panel. The interior of the flexible display panel usually adopts the structure of a flexible foldable module, and the flexible foldable module is mostly a module stack structure. However, for the flexible display panel prepared in the prior art, the production cost of the flexible foldable module is relatively high. At the same time, the structure design of the flexible foldable module is relatively thick and the general adaptability is low, which is not conducive to the improvement of the comprehensive performance of the display panel.

Therefore, it is necessary to propose solutions to the problems in the prior art.

SUMMARY OF DISCLOSURE

Accordingly, in the flexible display panel provided in the prior art, the flexible foldable module structure inside is relatively thick, and the design is unreasonable, which is not conducive to the improvement of the comprehensive performance of the display panel.

In order to solve the above problems, embodiments of the present invention provide a display device, which can effectively improve the structure of the flexible foldable module inside the flexible display panel and improve the overall performance of the display panel.

In order to solve the above-mentioned technical problems, the technical methods provided by the embodiments of the present invention are as follows:

A first aspect of embodiments of the present application provides a display device, comprising a bending region and a flat region disposed on at least a side of the bending region, wherein the display device comprises a display panel and a display module disposed on a side of the display panel, wherein the display module comprises:
 a first supporting layer, wherein the first supporting layer is disposed on a back side of the display panel;
 an adhesive layer, wherein the adhesive layer is disposed on a side of the first supporting layer away from the display panel; and
 a second supporting layer, wherein the second supporting layer is disposed on a side of the adhesive layer away from the first supporting layer;
 wherein an accommodating cavity is provided between the adhesive layer, the first supporting layer and the second supporting layer, and the accommodating cavity is at least correspondingly disposed in the bending region, and the bending region are also arranged with hollow holes therein, and an arrangement density of the hollow holes in a middle region of the bending region is greater than the arrangement density at an edge of the bending region.

According to an embodiment of the present application, the flat region comprises a first flat region and a second flat region, the bending region connects the first flat region and the second flat region, the accommodating cavity is correspondingly disposed in the bending region, wherein the adhesive layer in the first flat region and the adhesive layer in the second flat region are arranged symmetrically to the accommodating cavity.

According to an embodiment of the present application, a material and a thicknesses of the adhesive layer corresponding to both sides of the accommodating cavity are the same.

According to an embodiment of the present application, a width of the accommodating cavity is not less than a width of the bending region, and a height of the accommodating cavity is the same as a thickness of the adhesive layer.

According to an embodiment of the present application, outer edges of the adhesive layer in the first flat region and the second flat region are both flush with a side of the display panel.

According to an embodiment of the present application, the adhesive layer is a black light-shielding adhesive material, and the black light-shielding adhesive material is a black acrylate pressure-sensitive adhesive or a black optical adhesive.

A second aspect of embodiments of the present application further provides a display device, wherein the display device further comprises:
 a second adhesive layer, wherein the second adhesive layer is disposed on a side of the second supporting layer away from the first support layer; and
 a heat dissipation layer, wherein the heat dissipation layer is disposed on a side of the second adhesive layer away from the display panel, and the heat dissipation layer is disposed in the flat area.

Embodiments of the invention provide a display device to effectively improve the structure of the flexible folding module inside the flexible display panel and improve the overall performance of the display panel.

In order to solve the above-mentioned technical problems, the technical methods provided by the embodiments of the present invention are as follows:

A first aspect of embodiments of the present application provides a display device, comprising a bending region and a flat region disposed on at least a side of the bending region, wherein the display device comprises:

a display panel and a display module disposed on a side of the display panel;

wherein the display module comprises:

a first supporting layer, wherein the first supporting layer is disposed on a back side of the display panel;

an adhesive layer, wherein the adhesive layer is disposed on a side of the first supporting layer away from the display panel; and a second supporting layer, wherein the second supporting layer is disposed on a side of the adhesive layer away from the first supporting layer;

wherein an accommodating cavity is provided between the adhesive layer, the first supporting layer and the second supporting layer, and the accommodating cavity is at least correspondingly disposed in the bending region.

According an embodiment of the present application, the flat region comprises a first flat region and a second flat region, the bending region connects the first flat region and the second flat region, the accommodating cavity is correspondingly disposed in the bending region, wherein the adhesive layer in the first flat region and the adhesive layer in the second flat region are arranged symmetrically to the accommodating cavity.

According an embodiment of the present application, a material and a thicknesses of the adhesive layer corresponding to both sides of the accommodating cavity are the same.

According an embodiment of the present application, a width of the accommodating cavity is not less than a width of the bending region, and a height of the accommodating cavity is the same as a thickness of the adhesive layer.

According an embodiment of the present application, outer edges of the adhesive layer in the first flat region and the second flat region are both flush with a side of the display panel.

According an embodiment of the present application, the adhesive layer is a black light-shielding adhesive material.

According an embodiment of the present application, the adhesive layer is a black acrylate pressure-sensitive adhesive or a black optical adhesive.

According an embodiment of the present application, a stiffness of the first supporting layer corresponding to the bending region is greater than a stiffness of the first supporting layer corresponding to the flat region.

According an embodiment of the present application, the second supporting layer in the bending region is provided with a plurality of groups of hollow holes.

According an embodiment of the present application, the plurality of groups of hollow holes comprise a plurality of strip-shaped-shaped hollow holes spaced in a first direction, and the first direction is parallel to a bending direction of the device.

According an embodiment of the present application, a thickness of the corresponding second supporting layer in the bending region is smaller than a thickness of the corresponding second supporting layer in the flat region.

According an embodiment of the present application, a thickness of the adhesive layer is set to be between 5 um and 30 um.

According an embodiment of the present application, the display device further comprises a polarizer layer, an optical adhesive layer provided on the polarizer layer, a glass layer provided on the optical adhesive layer, and a protective layer on the glass layer.

According an embodiment of the present application, the display device further comprises:

a second adhesive layer, wherein the second adhesive layer is disposed on a side of the second supporting layer away from the first supporting layer; and a heat dissipation layer, wherein the heat dissipation layer is disposed on a side of the third adhesive layer away from the display panel, and the heat dissipation layer is disposed in the flat region.

Accordingly, beneficial effects of the embodiments of the present invention are:

Embodiments of the present invention provide a display device. The display device comprises a display panel and a display module, wherein the display module comprises a first supporting layer, an adhesive layer and a second supporting layer, the first supporting layer is bonded to the display panel, and the adhesive layer is connected to the first supporting layer are bonded together, while the second supporting layer and the adhesive layer are bonded together. An accommodating cavity structure is formed between the adhesive layer, the first supporting layer and the second supporting layer, and the accommodating cavity structure is correspondingly arranged in the bending region of the flexible display panel. The bending performance of the flexible foldable module in the flexible display panel can effectively improve the comprehensive performance of the display panel.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

The following descriptions of the various embodiments refer to the accompanying drawings to illustrate specific embodiments in which the present disclosure may be practiced.

With continuous developments of the display panel manufacturing technology, people have put forward higher requirements on the performance and quality of the display panel. It is hoped that the manufactured display panel not only has good quality, but also has good comprehensive performance.

Flexible display panels are used in many fields because they can be bent or folded. However, the flexible display panels provided in the prior art have unsatisfactory bending performance, for example, the thickness of the flexible foldable module inside the panel is thick, and the structural design is unreasonable, which is not conducive to the bending of the panel and reduces the comprehensive performance of the panel.

Figure 1:
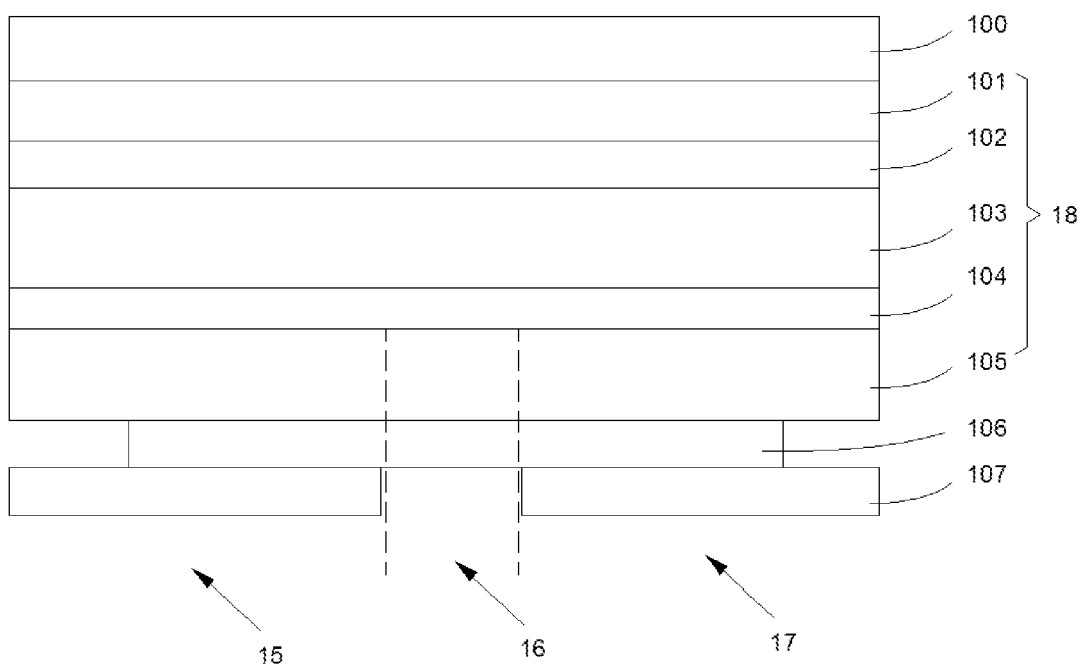
FIG. 1 is a schematic structural diagram of a flexible foldable device provided in the prior art.

As shown in FIG. 1, FIG. 1 is a schematic structural diagram of an exemplary flexible foldable device provided in the prior art. The flexible foldable device comprises a display panel 100 and a display module 18. The display module 18 is disposed on a side of the display panel 100. In order to ensure the performance of the display device, the display module 18 is arranged in a stacked structure of multiple film layers. Specifically, the display module comprises a supporting back film 101, a first pressure-sensitive adhesive layer 102, a foam layer 103, a second pressure-sensitive adhesive layer 104, and a supporting substrate 105, which are arranged in sequence. By arranging the foam layer 103 and other film layers in the display module, impact resistances and supporting effects of the display module can be effectively improved. However, since the above-mentioned module is stacked with multiple layers, a thickness of the module is relatively thick, and the production cost is also relatively high. At the same time, when the flexible panel is bent, the thicker module is not conducive to the bending of the panel, thereby reducing the improvement of the overall performance of the display panel.

An embodiment of the present invention provides a display device, so as to effectively improve the structure of the display module inside the display device and improve the overall performance of the display device.

Figure 2:
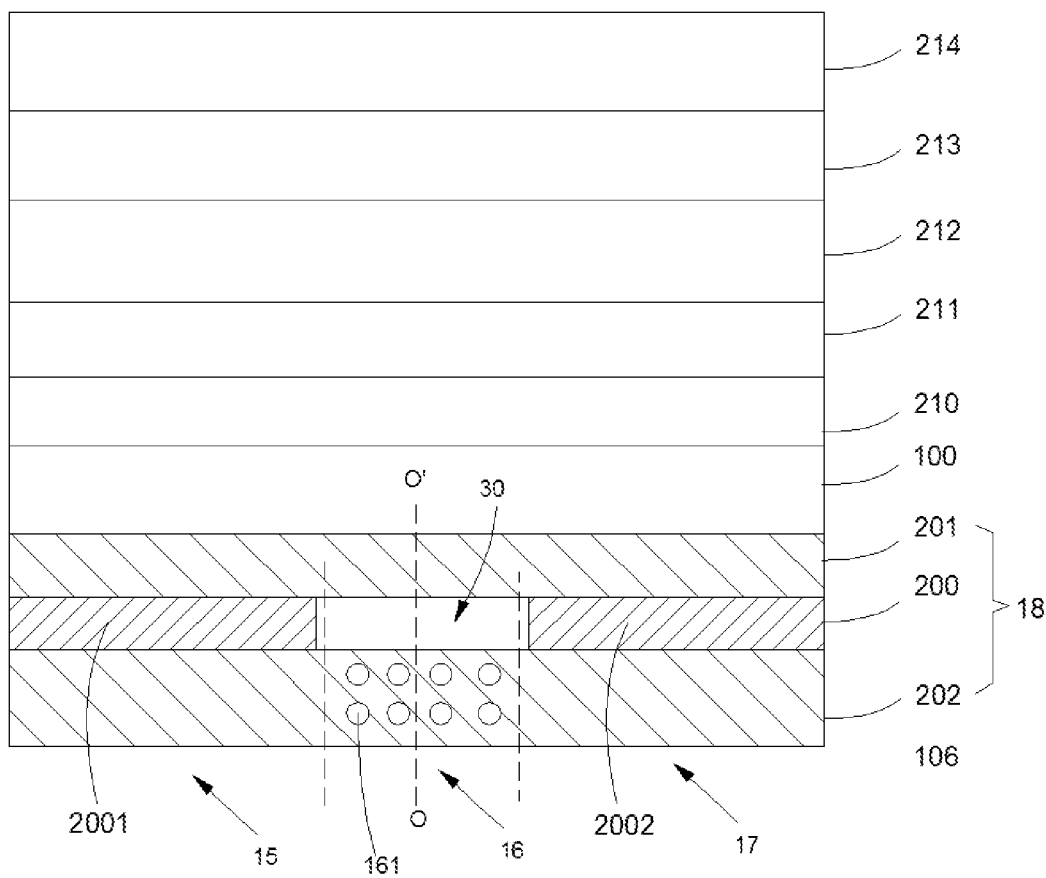
FIG. 2 is a schematic diagram of a film layer structure of a flexible display device provided by an embodiment of the present invention.

Specifically, as shown in FIG. 2, FIG. 2 is a schematic diagram of a film layer structure of a flexible display device provided by an embodiment of the present invention. The display device comprises a display panel 100 and a display module 18. The display module 18 is disposed on a side of the display panel 100, such as on a back side of the display panel, and is attached to the display panel.

In the embodiment of the present invention, the display device comprises a flat region and a bending region, wherein the bending region is disposed on at least a side of the flat region. Specifically, the flat region is described by taking the first flat region 15, the second flat region 17 and the bending region 16 as examples, and the bending region 16 connects the first flat region 15 and the second flat region 17. When the display device is bent, a bending center axis is located in the bending region 16, and the display panel 100 and the display module 18 are bent along the bending region 16, thereby realizing folding of the display panel.

Furthermore, the display module 18 comprises a first supporting layer 201, an adhesive layer 200, and a second supporting layer 202. The first supporting layer 201 is disposed on a side of the display panel 100 and is attached to the display panel 100. The adhesive layer 200 is disposed on a side of the first supporting layer 201 away from the display panel 100, and the second supporting layer 202 is disposed on a side of the adhesive layer 200 away from the first supporting layer 201. Furthermore, the first supporting layer 201, the adhesive layer 200, and the second supporting layer 202 are adhered to each other and constitute the display module provided in the embodiment of the present invention.

Specifically, the first supporting layer 201 may be configured to support the back film, and the display panel 100 may be configured as a flexible panel. At the same time, a material of the supporting back film is preferably a polymer resin material, and has a certain rigidity, and the flexible panel can be effectively supported by arranging the supporting back film.

In the embodiment of the present invention, the second supporting layer 202 may be configured as a support substrate, and a material of the support substrate may be an alloy, a metal material layer or a polymer layer. When the second supporting layer 202 is a metal layer, it can be an aluminum alloy material, and when the second supporting layer 202 is a polymer layer, it is preferably a tetrafluoroethylene polymer layer, polyethylene, polyimide and other material film layers.

In this embodiment of the present invention, a stiffness of the second supporting layer 202 is greater than a stiffness of the first supporting layer 201. Preferably, the stiffness of the second supporting layer 202 is set to be between 50 Gpa and 180 Gpa, and at the same time, a thickness of the second supporting layer 202 is greater than a thickness of the first supporting layer 201. Preferably, the thickness of the film layer of the second supporting layer 202 is set to between 8 um and 18 um. Specifically, the film thickness and film rigidity of the first supporting layer 201 and the second supporting layer 202 can be set according to the requirements of the actual product, which will not be described in detail here. In the embodiment of the present invention, by arranging the first supporting layer 201 and the second supporting layer 202, the display module not only has a good supporting effect, but also has a good bending performance.

Further, the adhesive layer 200 provided in the embodiment of the present invention is disposed between the first supporting layer 201 and the second supporting layer 202. The first supporting layer 201 and the second supporting layer 202 are bonded and fixed by the adhesive layer 200.

In the embodiment of the present invention, the adhesive layer 200 can be set as a black adhesive layer. Preferably, the black adhesive layer is a black optical adhesive (OCA) layer, a black pressure sensitive adhesive (PSA) layer, a black acrylate pressure sensitive adhesive material or other black materials with certain viscosity film layer. By setting the adhesive layer 200 as a black or opaque adhesive film layer, the optical properties of the display panel can be improved, and the overall performance of the display panel can be improved.

Specifically, in the embodiment of the present invention, the thickness of the adhesive layer is set to be between 5 um and 30 um.

Furthermore, in the embodiment of the present invention, the display module 18 further comprises an accommodating cavity 30. Specifically, the accommodating cavity 30 is in the adhesive layer 200 and is at least correspondingly disposed in the bending region 16 of the display device.

Specifically, the accommodating cavity 30 is formed between the adhesive layer 200, the first supporting layer 201 and the second supporting layer 202. In the embodiment of the present invention, the accommodating cavity 30 is correspondingly disposed in the bending region 16, and the adhesive layer 200 is disposed in at least the first flat region 15 and the second flat region 17. Therefore, the adhesive layer 200 is divided into two parts by the accommodating cavity 30, that is, the adhesive layer 200 comprises a first adhesive layer 2001 and a second adhesive layer 2002.

Herein, the first adhesive layer 2001 is correspondingly disposed in at least the first flat region 15, and the second adhesive layer 2002 is disposed in the second flat region 17 correspondingly. In the embodiment of the present invention, the first adhesive layer 2001 and the second adhesive layer 2002 are both disposed in the corresponding flat region as an example for description.

Preferably, as shown in FIG. 2, the central axis of the accommodating cavity 30 is OO', and the accommodating cavity 30 may be symmetrically arranged relative to the central axis OO', and the first adhesive layer 2001 and the second adhesive layer 2002 are also symmetrically arranged relative to the central axis OO'. This ensures that the film layers on both sides of the second supporting layer 202 have better consistency.

Further, the first adhesive layer 2001 and the second adhesive layer 2002 are both set to have the same thickness, and are prepared and formed by using the same material. Since the first adhesive layer 2001 and the second adhesive layer 2002 are symmetrically distributed with respect to the central axis OO', the widths of the first adhesive layer 2001 and the second adhesive layer 2002 can be the same, and an outer edge of the first adhesive layer 2001 is flush with an outer edge of the second supporting layer 202, and an outer edge of the second adhesive layer 2002 is flush with another outer edge of the second supporting layer 202.

In the embodiment of the present invention, the first adhesive layer 2001 and the second adhesive layer 2002 are symmetrically arranged relative to the central axis OO'. When the display device is bent in the bending region 16, the two sides of the display device can be maintained in a good symmetry, thereby ensuring the display effect of the display device.

Furthermore, in the embodiment of the present invention, the width of the accommodating cavity 30 may be greater than the width of the bending region 16. When the display device is bent, the accommodating cavity 30 will not hinder its deformation, thereby ensuring that the display device has better bending performance.

Referring to FIG. 2 for details, in the embodiment of the present invention, the second supporting layer 202 further comprises a plurality of groups of hollow holes 161. The hollow hole 161 is correspondingly disposed in the bending region 16 of the second supporting layer 202.

Specifically, the plurality of groups of hollow holes 161 can be uniformly arranged in the bending region 16, and when the hollow holes 161 are uniformly arranged in the bending region 16, a diameter of each hollow hole 161 can be the same. Thus, the fabrication process of the second supporting layer 202 is simplified.

Preferably, the hollow hole 161 can be configured as a circular through hole, a square through hole, a strip-shaped through hole or a through hole structure of other shapes. Since the bending region 16 is bent, the hollow hole 161 can effectively reduce the bending stress during bending, thereby improving the bending effect of the second supporting layer 202.

Figure 3:
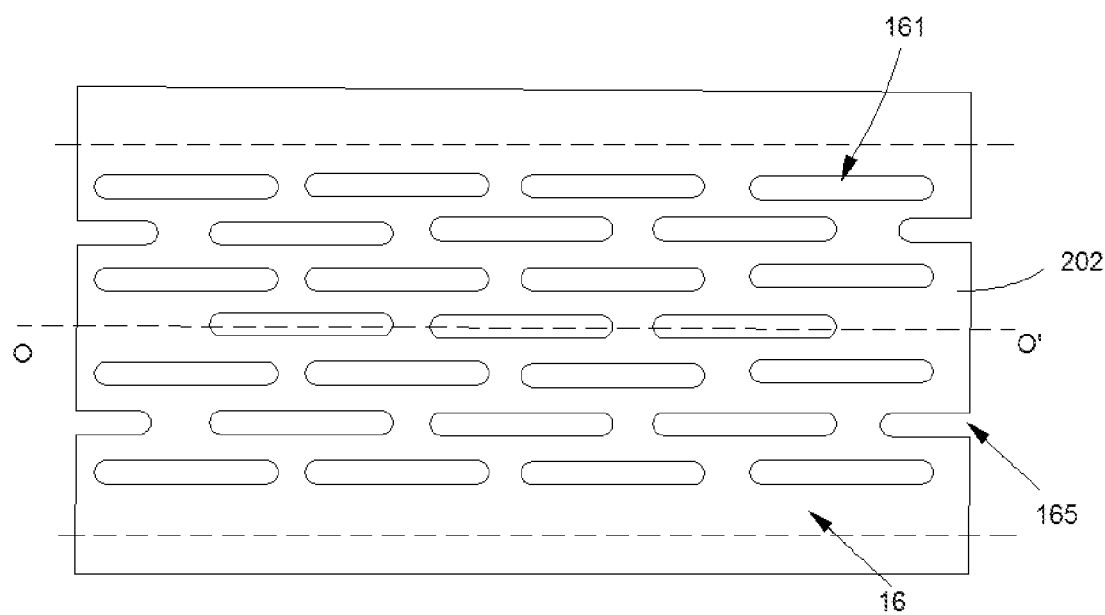
FIG. 3 is a schematic plan view of a second supporting layer provided by an embodiment of the present invention.

As shown in FIG. 3, FIG. 3 is a schematic plan view of a second supporting layer according to an embodiment of the present invention. In the embodiment of the present invention, the hollow holes 161 are arranged as strip-shaped holes, a plurality of strip-shaped holes 161 are arranged in the bending region 16 in an array, and the corresponding hollow holes 161 in two adjacent rows are not parallel to each other. Herein, extending directions of the plurality of strip-shaped holes 161 are the same. If they are all disposed toward the first direction, the first direction is parallel to the horizontal direction, or the first direction is parallel to the bending direction of the second supporting layer. At the same time, the strip-shaped holes 161 in the bending region 16 are symmetrically arranged relative to the central axis OO', so that the second supporting layer 202 has better symmetry when being bent.

In the embodiment of the present invention, at least part of the hollow holes 161 intersect with an edge of the second supporting layer 202, and an opening 165 is formed on the corresponding edge side. When the display device is bent, the opening 165 facilitates the bending of the supporting layer.

Figure 4:
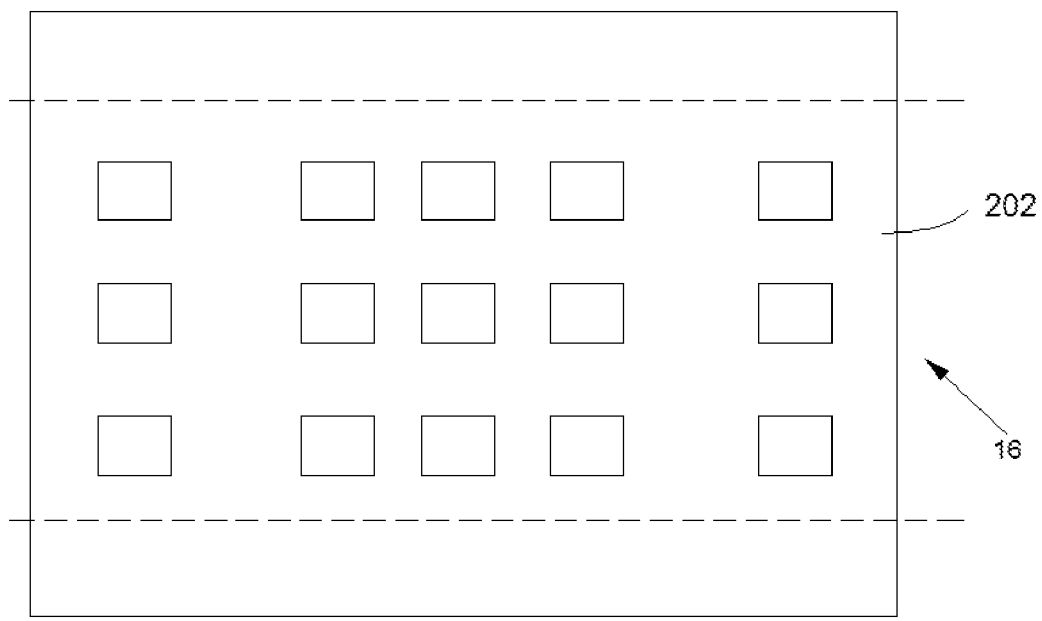
FIG. 4 is a schematic structural diagram of another second supporting layer provided by an embodiment of the present invention.

As shown in FIG. 4, FIG. 4 is a schematic structural diagram of another second supporting layer provided by an embodiment of the present invention. In the embodiment of the present invention, the hollow holes are set as square holes, and in the bending region 16, the arrangement density of the square holes in the middle region near the bending region 16 is greater than the arrangement density of the square holes at the edge regions on both sides, or the hole diameter of the square hole at the central region is larger than the hole diameter of the square hole at the edge region.

Furthermore, in the embodiment of the present invention, the hollow hole may also be set to other shapes or structures, which will not be described in detail here.

Figure 5:
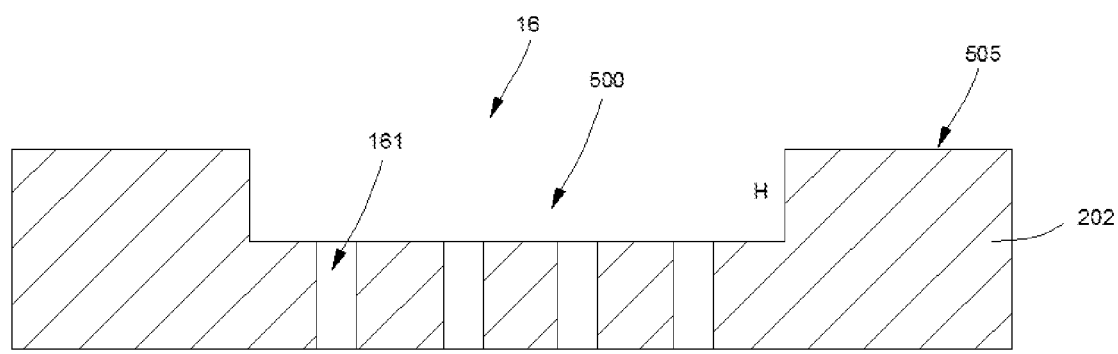
FIG. 5 is a schematic diagram of a film structure of another second supporting layer provided in an embodiment of the present invention.

As shown in FIG. 5, FIG. 5 is a schematic diagram of a film layer structure of yet another second supporting layer provided by an embodiment of the present invention. Since the display device is bent in the bending region 16, the thickness of the film layer in the bending region 16 is reduced. That is, the second supporting layer 202 is further provided with a groove 500, the groove 500 is provided in the bending region 16, and the groove 500 is provided on a side of the second supporting layer 202 away from the adhesive layer.

In the embodiment of the present invention, a distance between the first surface 505 of the second supporting layer 202 and the bottom of the groove 500 is set to H, so that the value of the distance H is less than half of the thickness of the second supporting layer 202. The grooves 500 are arranged symmetrically with respect to the central axis of the bending region 16.

Since the second supporting layer 202 is provided with the groove 500, the hollow hole 161 is disposed on the second supporting layer 202 and penetrates the groove 500. When the display panel is bent in the bending region 16, the thickness of the second supporting layer 202 is relatively thin, and the hollow holes and groove structures are correspondingly provided, so as to ensure the display device has a better support effect and also more prone to bending.

Preferably, as shown in Table 1 below, Table 1 shows various test results of corresponding display panels under different schemes.

TABLE 1 test results of the corresponding display panels under different schemes

| | scheme | | | | |
|---|---|---|---|---|---|
| | 1 | 2 | 3 | 4 | 5 |
| thickness | 150 um | 5 um | 15 um | 25 um | 35 um |
| pen drop | 4 cm-5 cm | 4 cm-5 cm | 4 cm-5 cm | 4 cm-5 cm | 4 cm-5 cm |
| ball drop | <2 cm | <2 cm | <2 cm | <2 cm | <2 cm |
| Cost | high | low | low | low | low |
| reflection rate | 4.7% | 4.8% | 4.8% | 4.8% | 4.7% |
| bending property | poor | slight crease | slight crease | micro crease | poor |

The experimental properties under different structural parameters are given in Table 1. Specifically, scheme 1 is a display module using foam, and schemes 2 to 5 are display modules formed by using the adhesive layer material provided in the examples of this application, such as black optical glue material. In scheme 1, the thickness of the foam is 150 um, and in scheme 2 to scheme 5, the thickness of the black optical adhesive is 5 um, 15 um, 25 um, and 30 um in sequence. Meanwhile, other film structures and parameters of the display panel in each scheme are the same, for example, other film layers of the display panel are set according to the panel film structure provided in FIG. 2 of the embodiment of the present application.

According to the above experimental results, the display panel using the foam structure in the prior art needs to set the foam to be thicker, thereby increasing the total thickness of the display panel and the production cost, and the universality of the foam structure is also relatively low. However, when the optical adhesive material provided in the embodiment of the present application is used, the thickness of the optical adhesive is greatly reduced, thereby effectively reducing the production cost of the panel. When the optical glue is set to a thickness between 5 um and 25 um, and the display panel is bent, only slight creases appear at the bending region, and when the thickness of the optical glue is increased to 35 um or if the foam structure in scheme 1 is directly used, there will be more creases in the bending region, and even cracks will appear. At the same time, through experiments, when the thickness of the optical adhesive is set to 30 um, the corresponding performance of the display panel is still good.

At the same time, further pen and ball drop tests were performed on the display panels in different schemes. It can be seen that all panels can pass the test, and during the test, the difference between the measured data is small, and the difference can be ignored. Therefore, when the optical adhesive in the embodiment of the present application is used for setting, although the thickness of the optical adhesive is greatly reduced, the corresponding display panel still has good anti-drop performance. Accordingly, the thickness of the corresponding display panel is reduced, and the production cost thereof is also reduced.

Furthermore, the optical reflectivity corresponding to the display panel provided in the embodiments of the present application is still good, thereby effectively ensuring the luminous performance of the display panel.

In the embodiment of the present invention, the length direction of the groove 500 is the same as the bending direction of the display device, and arc transitions are performed at the inner corners of the groove 500 to reduce the excess generation of the second supporting layer 202 during bending. bending stress. Preferably, the width of the groove 500 can also be reduced, and a plurality of grooves are arranged in the bending region 16 at intervals.

Please refer to FIG. 2, in the embodiment of the present invention, the display device further comprises a polarizer 210, a first optical adhesive layer 211, a glass layer 212, a second optical adhesive layer 213, and a cover plate 214.

Specifically, the polarizer 210 is disposed on the display panel 100, the first optical adhesive layer 211 is disposed on the polarizer 210, the glass layer 212 is disposed on the first optical adhesive layer 211, and the second optical adhesive layer 213 is disposed on the glass layer 212, and at the same time, the cover plate 214 is disposed on the second optical adhesive layer 213.

Herein, the first optical adhesive layer 211 and the second optical adhesive layer 213 may be the same adhesive layer, which mainly play the role of pasting two different film layers, such as transparent acrylic adhesive layers, and the two optical adhesive layers are set to be the same thickness of. Furthermore, the glass layer 212 in the display device can also be configured as a transparent plastic film layer, or other optical film layers that increase the light transmittance of the display panel. Meanwhile, in the embodiment of the present invention, other functional film layers may also be disposed on the display panel film layer, so as to effectively improve the display effect of the display device. The cover plate 214 can also be set to other protective film layers, which will not be described in detail here.

When the flexible display device provided in the embodiment of the present invention is an OLED display device, the polarizer 210 can be set as a circular polarizer, which has a relatively high refractive index to ambient light, thereby effectively reducing the overall reflectivity of the display device and improving the device display.

The cover plate 214 can be a flexible cover plate. For example, the material of the cover plate 214 is polyimide material, so that the display device has better bending performance and can be bent together with the display panel 100 and other flexible film layers. The cover plate 214 can also be configured as a glass cover plate or the like.

Figure 6:
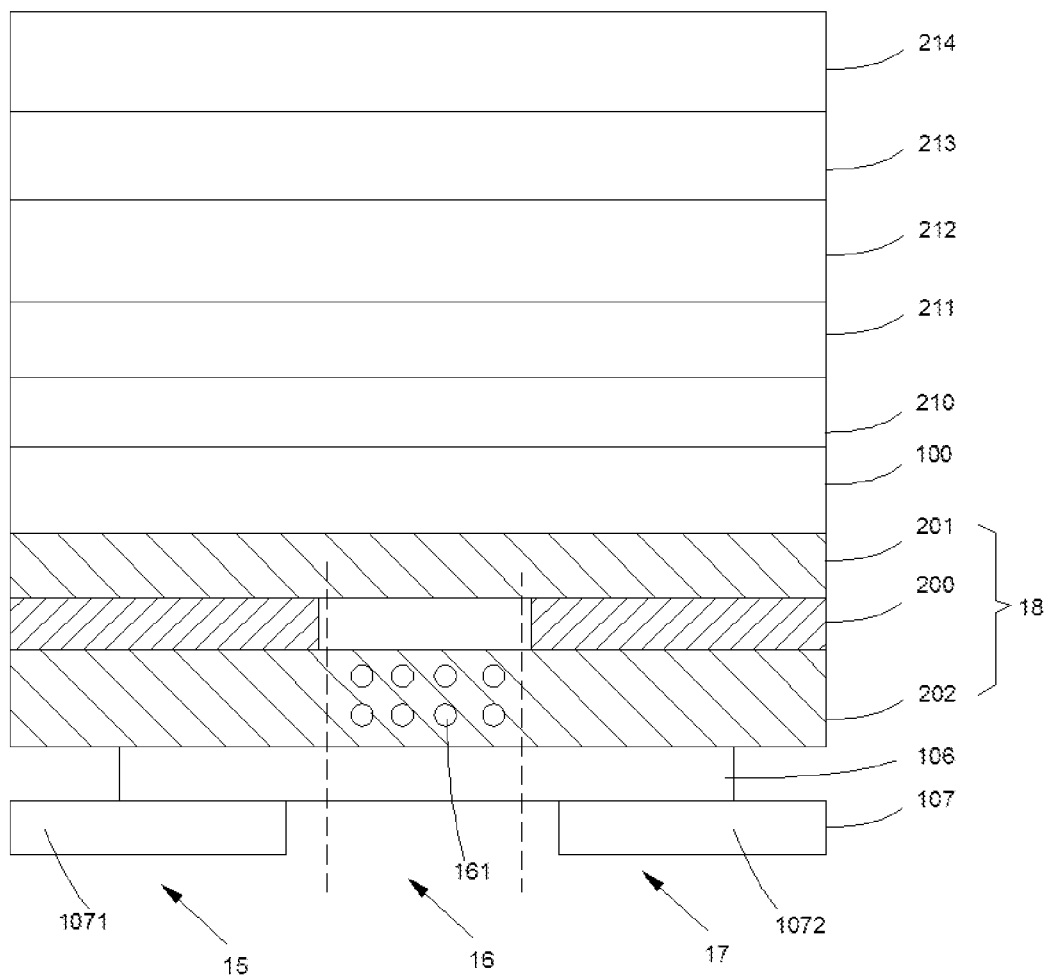
FIG. 6 is a schematic diagram of a film layer structure of another display device according to an embodiment of the present invention.

As shown in FIG. 6, FIG. 6 is a schematic diagram of a film layer structure of another display device according to an embodiment of the present invention. With reference to the film layer structures in FIGS. 1-5, in this embodiment of the present invention, the display device further comprises a third adhesive layer 106 and a heat dissipation layer 107. The third adhesive layer 106 is disposed on a side of the display module 18 away from the display panel 100, the third adhesive layer 106 is disposed at least in the bending region 16, and the third adhesive layer 106 is disposed corresponding to the hollow hole 161. When the material in the display module 18 falls from the hollow hole 161, it can be adsorbed on the third adhesive layer 106, thereby avoiding the influence of external factors on the display device.

In the embodiment of the present invention, a projected region of the second supporting layer 202 on the display panel is larger than a projected region of the third adhesive layer 106 on the display panel. And the thickness of the third adhesive layer 106 is smaller than the thickness of the adhesive layer 200.

Meanwhile, the heat dissipation layer 107 is disposed on a side of the third adhesive layer 106 away from the second supporting layer 202. The heat dissipation layers 107 may be provided in multiples. As shown in FIG. 6, the heat dissipation layers 107 are correspondingly disposed relative to the bending regions 16. That is, the heat dissipation layer 107 comprises a first sub-heat-dissipation layer 1071 and a second sub-heat-dissipation layer 1072, wherein the first sub-heat-dissipation layer 1071 is arranged in the first flat region 15, and the second sub-heat-dissipation layer 1072 is arranged in the second flat region 17. The thickness and length of the first sub-heat dissipation layer 1071 and the second sub-heat dissipation layer 1072 are the same.

In the embodiment of the present invention, there is a certain distance between the first sub-heat dissipation layer 1071 and the second sub-heat dissipation layer 1072, and the width of the distance is at least greater than the width of the bending region 16. Furthermore, the outer edges of the first sub-heat dissipation layer 1071 and the outer edges of the second sub-heat dissipation layer 1072 are both flush with the sides of the corresponding display device.

Specifically, the first sub-heat-dissipation layer 1071 and the second sub-heat-dissipation layer 1072 may both be made of metal materials, such as copper, iron and other metal materials. In the embodiment of the present invention, the thicknesses of the first sub-heat dissipation layer 1071 and the second sub-heat dissipation layer 1072 are both smaller than the thickness of the second supporting layer 202.

The display device provided by the embodiment of the present invention may be any product or component with display function, such as an OLED panel, a mobile phone, a computer, electronic paper, a display, a notebook computer, and a digital photo frame, and the specific type thereof is not specifically limited.

The display device is composed of the above-mentioned display panel and the corresponding display module, thereby improving the complex structure of the display module in the display device, which is not conducive to the bending of the panel and the low comprehensive performance of the panel.

The above is a detailed introduction to a display device provided by the embodiments of the present application. Specific examples are used in this article to illustrate the principles and implementations of the present application. The description of the above embodiments is only used to help understand the present application The method of application and its core idea; meanwhile, for those skilled in the art, according to the idea of this application, there will be changes in the specific implementation and the scope of application. In summary, the content of this specification should not be understood as Restrictions on this application.

What is claimed is:

1. A display device, comprising a bending region and a flat region disposed on at least a side of the bending region, wherein the display device comprises:
    a display panel and a display module disposed on a side of the display panel in a thickness direction of the display device;
    wherein the display module comprises a first supporting layer, an adhesive layer, and a second supporting layer, which are stacked in sequence in the thickness direction,
    wherein the first supporting layer is directly attached to a back side of the display panel, and the first supporting layer is selected from a polymer back film;
    the adhesive layer is directly attached to a side of the first supporting layer away from the display panel; and
    the second supporting layer is directly attached to a side of the adhesive layer away from the first supporting layer;
    wherein an accommodating cavity is provided in an area of the adhesive layer at least corresponding to the bending region, the second supporting layer is made of a polymer material and hollow holes are disposed in the second supporting layer corresponding to the bending region, an arrangement density of the hollow holes in a middle region of the bending region is greater than the arrangement density at an edge of the bending region, and the hollow holes have a circular cross-section in the thickness direction of the display device and extend in a direction perpendicular to the thickness direction, so that the hollow holes do not pass through opposite surfaces of the second supporting layer in the thickness direction.

2. The display device of claim 1, wherein the flat region comprises a first flat region and a second flat region, the bending region connects the first flat region and the second flat region, wherein the adhesive layer in the first flat region and the adhesive layer in the second flat region are arranged symmetrically to the accommodating cavity.

3. The display device according to claim 2, wherein a material and a thicknesses of the adhesive layer corresponding to both sides of the accommodating cavity are the same.

4. The display device according to claim 3, wherein a width of the accommodating cavity is not less than a width of the bending region, and a height of the accommodating cavity is the same as a thickness of the adhesive layer.

5. The display device according to claim 3, wherein outer edges of the adhesive layer in the first flat region and the second flat region are both flush with a side of the display panel.

6. The display device according to claim 1, wherein the adhesive layer is a black light-shielding adhesive material, and the black light-shielding adhesive material is a black acrylate pressure-sensitive adhesive or a black optical adhesive.

7. The display device according to claim 1, wherein the display device further comprises a polarizer layer, an optical adhesive layer provided on the polarizer layer, a glass layer provided on the optical adhesive layer, and a protective layer on the glass layer.

8. The display device according to claim 7, further comprising:
    a third adhesive layer, wherein the third adhesive layer is disposed on a side of the second supporting layer away from the first supporting layer; and
    a heat dissipation layer, wherein the heat dissipation layer is disposed on a side of the third adhesive layer away from the display panel, and the heat dissipation layer is disposed in the flat region.

9. A display device, comprising a bending region and a flat region disposed on at least a side of the bending region, wherein the display device comprises:
    a display panel and a display module disposed on a side of the display panel in a thickness direction of the display device;
    wherein the display module comprises a first supporting layer, an adhesive layer, and a second supporting layer which are stacked in sequence in the thickness direction,
    wherein the first supporting layer is directly attached to a back side of the display panel, and the first supporting layer is selected from a polymer back film;
    the adhesive layer is directly attached to a side of the first supporting layer away from the display panel; and
    the second supporting layer is directly attached to a side of the adhesive layer away from the first supporting layer;
    wherein an accommodating cavity is provided in an area of the adhesive layer at least corresponding to the bending region, the second supporting layer is made of a polymer material and hollow holes are disposed in the second supporting layer corresponding to the bending region, and the hollow holes have a circular cross-section in the thickness direction of the display device and extend in a direction perpendicular to the thickness direction, so that the hollow holes do not pass through opposite surfaces of the second supporting layer in the thickness direction.

10. The display device of claim 9, wherein the flat region comprises a first flat region and a second flat region, the bending region connects the first flat region and the second flat region, wherein the adhesive layer in the first flat region and the adhesive layer in the second flat region are arranged symmetrically to the accommodating cavity.

11. The display device according to claim 10, wherein a material and a thicknesses of the adhesive layer corresponding to both sides of the accommodating cavity are the same.

12. The display device according to claim 11, wherein a width of the accommodating cavity is not less than a width of the bending region, and a height of the accommodating cavity is the same as a thickness of the adhesive layer.

13. The display device according to claim 11, wherein outer edges of the adhesive layer in the first flat region and the second flat region are both flush with a side of the display panel.

14. The display device according to claim 9, wherein the adhesive layer is a black light-shielding adhesive material.

15. The display device according to claim 14, wherein the adhesive layer is a black acrylate pressure-sensitive adhesive or a black optical adhesive.

16. The display device according to claim 9, wherein a stiffness of the first supporting layer is less than a stiffness of the second supporting layer.

17. The display device of claim 9, wherein a thickness of the corresponding second supporting layer in the bending region is smaller than a thickness of the corresponding second supporting layer in the flat region.

18. The display device according to claim 9, wherein a thickness of the adhesive layer is set to be between 5 um and 30 um.

* * * * *